United States Patent [19]

Eggermont

[11] 4,233,684
[45] Nov. 11, 1980

[54] ARRANGEMENT FOR DECODING A SIGNAL ENCODED BY MEANS OF ADAPTIVE DELTA MODULATION

[75] Inventor: Ludwid D. J. Eggermont, Eindhoven, Netherlands

[73] Assignee: U.S. Philips Corporation, New York, N.Y.

[21] Appl. No.: 9,208

[22] Filed: Feb. 5, 1979

[30] Foreign Application Priority Data

Feb. 21, 1978 [NL] Netherlands .................. 7801909

[51] Int. Cl.³ .......................................... H03K 13/22
[52] U.S. Cl. ...................................... 375/30; 375/96
[58] Field of Search ............... 325/38 B; 332/11 D; 375/28, 30, 31, 32, 96, 103

[56] References Cited

U.S. PATENT DOCUMENTS

| | | | |
|---|---|---|---|
| 3,904,963 | 9/1975 | Bellanger et al. | 325/38 B |
| 3,906,400 | 9/1975 | Gooding et al. | 325/38 B |
| 3,916,314 | 10/1975 | Franaszek et al. | 325/38 B |
| 3,922,619 | 11/1975 | Thompson | 332/11 D |
| 3,949,299 | 4/1976 | Song | 325/38 B |
| 3,987,288 | 10/1976 | Franks | 325/38 B |
| 4,002,981 | 6/1977 | Eggermont | 325/38 B |
| 4,087,754 | 5/1978 | Song | 325/38 B |
| 4,109,110 | 8/1978 | Gingell | 325/38 B |

*Primary Examiner*—Benedict V. Safourek
*Attorney, Agent, or Firm*—Thomas A. Briody; William J. Streeter; Edward W. Goodman

[57] ABSTRACT

Arrangement for decoding a compressed delta modulation signal, wherein, to simplify the anaogue output filter, an interpolating digital filter having a signal-independent pulse response is included in the dynamic expansion circuit.

2 Claims, 4 Drawing Figures

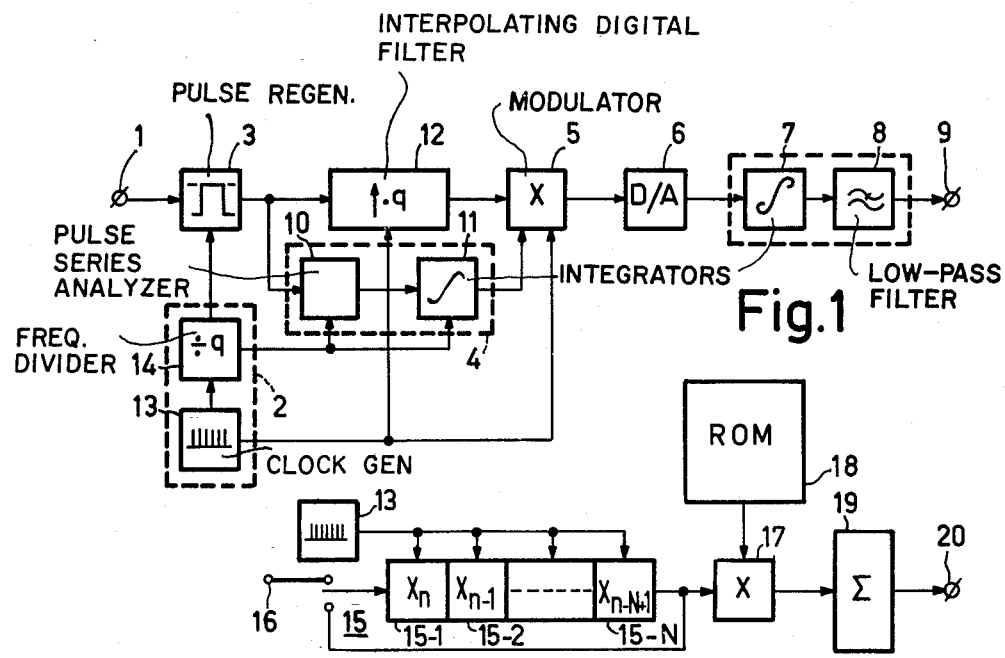
Fig. 1
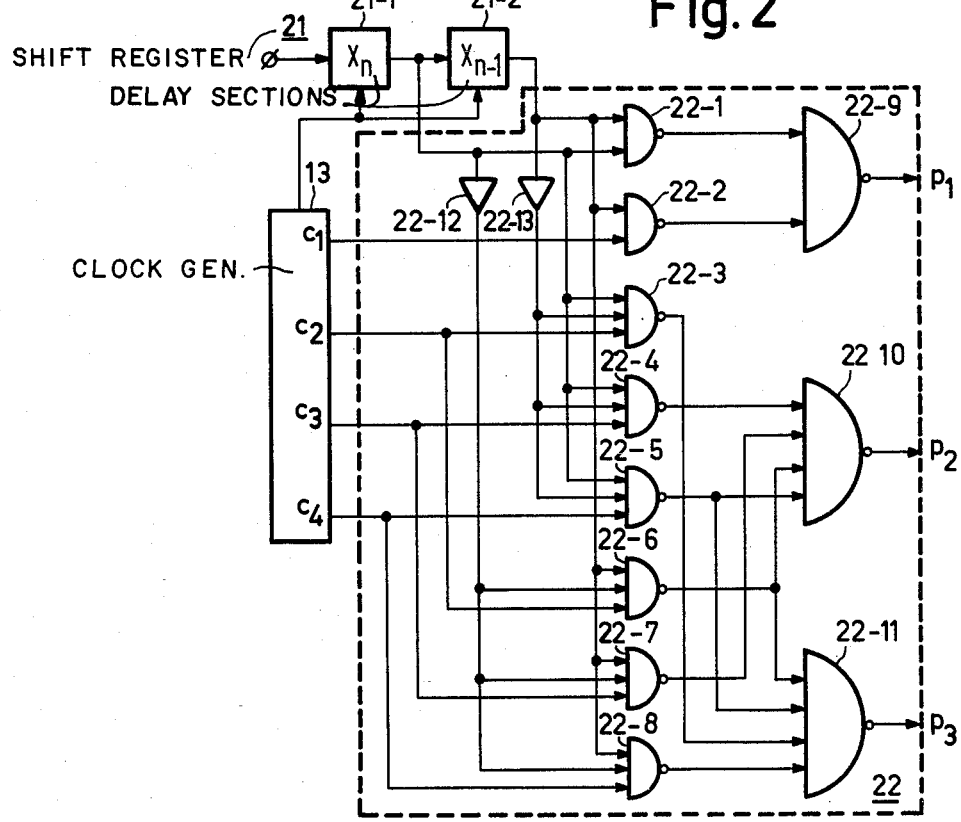
Fig. 2
Fig. 3

ARRANGEMENT FOR DECODING A SIGNAL ENCODED BY MEANS OF ADAPTIVE DELTA MODULATION

FIELD OF THE INVENTION

The invention relates to an arrangement for decoding a digital signal formed by an analogue data signal encoded by adaptive delta modulation, the arrangement comprising a dynamic expansion circuit having a dynamic control signal generator and a pulse modulator for modulating by the dynamic control signal the digital signal to be decoded, the modulated signal being applied to a converter for reproduction of the analogue data signal.

Adaptive delta modulation must be understood to include adaptive delta-sigma modulation.

DESCRIPTION OF THE PRIOR ART

An arrangement of the type defined above is disclosed in U.S. Pat. No. 3,703,688 (FIG. 1 in particular). In this known arrangement the converter comprises the cascade arrangement of an integrator and a low-pass filter.

If the analogue data signal has been encoded by means of adaptive delta-sigma modulation the converter comprises no integrator but only a low-pass filter.

When using the known arrangement the modulated digital signal comprises components having a frequency equal to the pulse repetition rate of the digital signal to be decoded. These components may have a rather large amplitude and the low-pass filter will have a rather complex structure in order to be able to suppress said components to a sufficient extent without undue attenuation of the frequency spectrum of the analogue data signal.

SUMMARY OF THE INVENTION

It is an object of the invention to provide an arrangement of the kind defined in the preamble, wherein an accurate reproduction of the analogue data signal is realized and wherein, relative to the prior art, a simpler low-pass filter can be used.

To this end the arrangement according to the invention comprises an interpolating digital filter having a signal-independent pulse response for interpolating, prior to modulation by the dynamic control signal, the digital signal to be decoded.

It should be noted that it is a generally known fact that a filter for filtering digital signals can be simplified by increasing the repetition rate of the signals to be supplied to the filter.

Simplifying the low-pass filter is important in order to reduce the plurality of components which must be separately provided externally of integrated circuitry in a solid state implementation of an arrangement of the type defined in the preamble.

The invention is based on the recognition that increasing the repetition rate of the digital signal prior to the modulation by means of the dynamic control signal may be effected if the condition, that the dynamic control signal varies only slowly over a time interval corresponding to the length of the pulse response of the interpolating filter to be used, has been satisfied. When using adaptive delta modulation with syllabic compression for encoding data signals of a speech signal character, it was found in practice that said condition is substantially always satisfied at a pulse response extending over only a few periods, for example not more than 5, of the digital signal.

By using the measure according to the invention it is achieved, while maintaining the advantage of an implementation in which only a small number of components are required externally of an integrated circuit of the arrangement, for example one or two RC-sections of high-value resistors and capacitors, that the integrated circuit itself can be as simple as possible, because the interpolating filter need only be arranged for processing one-bit delta modulation words.

SHORT DESCRIPTION OF THE FIGURES

Embodiments of the arrangement according to the invention will now be further explained with reference to the figures, wherein FIG. 1 shows an arrangement according to the invention, FIG. 2 shows by means of a block diagram an interpolating digital filter for use in the arrangement of FIG. 1, FIG. 1 shows an advantageous embodiment of an interpolating digital filter for use in the arrangement of FIG. 1, FIG. 4 shows some time diagrams for explaining the operation of the interpolating digital filter of FIG. 3.

DETAILED DESCRIPTION OF THE FIGURES

Figure 4:
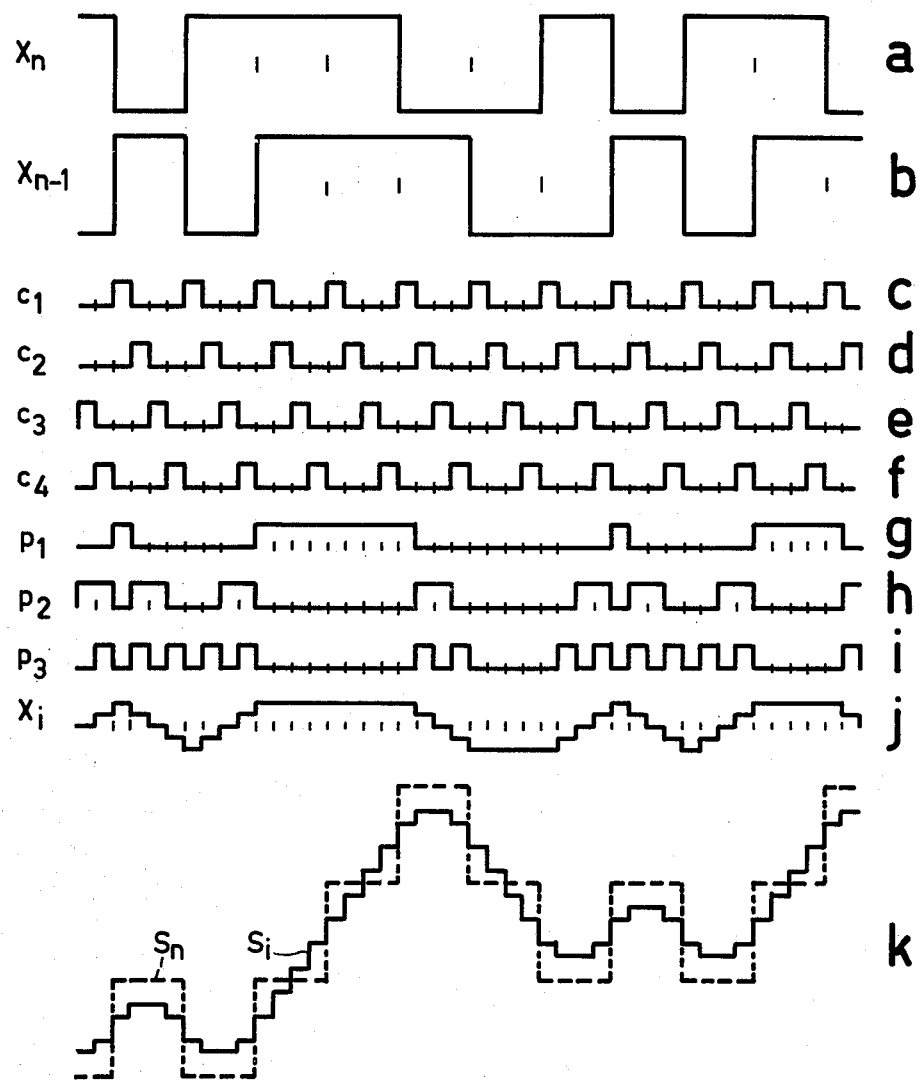

The arrangement according to the invention, shown in FIG. 1, comprises an input terminal 1, for receiving a digital signal formed by an analogue data signal encoded by adaptive delta modulation. The pulses, having a repetition frequency $f_s$, from which the digital signal is built-up constitute one-bit code words which, via a pulse regenerator 3 controlled by a pulse generator unit 2, are applied to a dynamic control signal generator 4 and a digital pulse modulator 5. The value of the appled code words is varied in the digital pulse modulators in proportion with the dynamic control signal. Via a digital-to-analog converter 6, the output code words of the digital pulse modulator 5 are applied to a converter consisting of an integrator 7 and a low-pass filter 8, for reproduction of the analogue data signal which can be taken from an output terminal 9 for further processing.

The dynamic control signal generator 4 is implemented in known manner, for example as described in U.S. Pat. No. 3,729,678, issued Apr. 24, 1973, from a pulse series analyser 10 and an integrating network 11.

In order to simplify the low-pass filter 8, the arrangement of FIG. 1 comprises, in accordance with the invention, an interpolating digital filter 12 having a signal-independent pulse response for interpolating the digital signal to be decoded prior to the modulation by the dynamic control signal. The interpolating digital filter 12 increases the sampling rate of the applied pulses by a factor q, to $q \cdot f_s$.

The pulse generator unit 2 comprises a pulse generator 13, for generating pulses having a frequency $q \cdot f_s$ for controlling the interpolating digital filter 12 and the pulse modulator 5, and a frequency divider 14 connected to the pulse generator 13 and, which supplies pulses having a frequency $f_s$ for controlling the pulse regenerator 3, the pulse series analyser 10 and the integrator 11.

It should be noted that the digital-to-analogue converter 6 may alternatively be included between the interpolating digital filter 12 and the pulse modulator 5. In that case integrator 11 is implemented so that an analogue dynamic control signal is obtained and the pulse modulator 5 may be in the form of an analogue pulse amplitude modulator.

FIG. 2 shows a block diagram of an interpolating digital filter for use in the arrangement of FIG. 1. Such a digital filter is described in greater detail in U.S. Pat. No. 3,988,607, issued Oct. 26, 1976. In the embodiment shown here, it comprises a circulating shift register 15 consisting of N delay sections 15-1, 15-2, . . . 15-N to which the delta modulation bits $X_n$ are applied by way of an input 16. Under the control of shift pulses supplied by the pulse generator 13, the delta modulation bits are consecutively applied to a multiplier 17 which supplies output pulses which form, in combination with filter coefficients stored in a ROM-(Read Only Memory) 18, a weighted version of the delta modulation bits applied thereto. The output pulses of the multiplier 17 are thereafter applied to an adder 19 for supplying the interpolated delta modulation signal at an output terminal 20.

An advantageous embodiment of the interpolating digital filter is shown in FIG. 3. The delta modulation bits $X_n$ and $X_{n-1}$ to be filtered are applied to a shift register 21, which is implemented from two delay sections 21-1 and 21-2 and are thereafter applied together with clock pulses $c_1$, $c_2$, $c_3$ and $c_4$, produced by the clock pulse generator 13, to a logic circuit 22 which consists of logic NAND-gates 22-1 to 22-11, and inverters 22-12 and 22-13. Output bits $p_1$, $p_2$ and $p_3$, which characterize, by means of a binary code, the interpolated value of the delta modulation bits, occur at the outputs of the NAND-gates 22-9, 22-10 and 22-11, respectively. Table 1 shows a truth table of the logic circuit 22 to explain the operation of the interpolating filter shown in FIG. 1.

TABLE 1

| $X_n$ | $X_{n-1}$ | $c_1$ | $c_2$ | $c_3$ | $c_4$ | $P_1$ | $P_2$ | $P_3$ |
|---|---|---|---|---|---|---|---|---|
| 0 | 0 | 0 | 0 | 0 | 1 | 0 | 0 | 0 |
| 0 | 0 | 0 | 0 | 1 | 0 | 0 | 0 | 0 |
| 0 | 0 | 0 | 1 | 0 | 0 | 0 | 0 | 0 |
| 0 | 0 | 1 | 0 | 0 | 0 | 0 | 0 | 0 |
| 0 | 1 | 0 | 0 | 0 | 1 | 1 | 0 | 0 |
| 0 | 1 | 0 | 0 | 1 | 0 | 0 | 1 | 1 |
| 0 | 1 | 0 | 1 | 0 | 0 | 0 | 1 | 0 |
| 0 | 1 | 1 | 0 | 0 | 0 | 0 | 0 | 1 |
| 1 | 0 | 0 | 0 | 0 | 1 | 0 | 0 | 0 |
| 1 | 0 | 0 | 0 | 1 | 0 | 0 | 0 | 1 |
| 1 | 0 | 0 | 1 | 0 | 0 | 0 | 1 | 0 |
| 1 | 0 | 1 | 0 | 0 | 0 | 0 | 1 | 1 |
| 1 | 1 | 0 | 0 | 0 | 1 | 1 | 0 | 0 |
| 1 | 1 | 0 | 0 | 1 | 0 | 1 | 0 | 0 |
| 1 | 1 | 0 | 1 | 0 | 0 | 1 | 0 | 0 |
| 1 | 1 | 1 | 0 | 0 | 0 | 1 | 0 | 0 |

FIG. 4 shows some time diagrams for illustrating the operation of the filter of FIG. 3. FIG. 4a shows the delta modulation signal $X_n$ to be decoded and FIG. 4b shows the signal $X_{n-1}$ delayed over one period. FIG. 4c-f shows the clock pulses $c_1$-$c_4$, and FIG. 4g-i shows the output bits $p_1$-$p_3$. FIG. 4j shows the interpolated delta modulation signal after D/A conversion, wherein for simplicity's sake the dynamic control signal is assumed to be constant. Finally, $S_n$ denotes the integrated original delta modulation signal and $S_i$ the integrated interpolated delta modulation signal.

What is claimed is:

1. An arrangement for decoding a digital signal formed by an analogue data signal encoded by adaptive delta modulation, the arrangement comprising a dynamic expansion circuit having a dynamic control signal generator and a pulse modulator for modulating by the dynamic control signal the digital signal to be decoded, the modulated signal being applied to a converter for reproduction of the analogue data signal, wherein the arrangement further comprises an interpolating digital filter, having a signal-independent pulse response, for interpolating, prior to modulation by the dynamic control signal, the digital signal to be decoded.

2. An arrangement as claimed in claim 1, wherein the interpolating digital filter comprises a circulating shift register implemented from two delay elements, as well as a combinatory network connected thereto and implemented from logic circuit elements.

* * * * *